United States Patent [19]
Jarrett

[11] Patent Number: 5,622,511
[45] Date of Patent: Apr. 22, 1997

[54] FLOATING CONNECTOR HOUSING

[75] Inventor: Brian S. Jarrett, Cornelius, Oreg.

[73] Assignee: Intel Corporation, Santa Clara, Calif.

[21] Appl. No.: 570,540

[22] Filed: Dec. 11, 1995

[51] Int. Cl.⁶ .................................................. H01R 13/74
[52] U.S. Cl. .......................... 439/248; 439/565; 439/378
[58] Field of Search .................................... 439/248, 247, 439/563–565, 570, 378

[56] References Cited

U.S. PATENT DOCUMENTS

| | | | |
|---|---|---|---|
| 5,228,865 | 7/1993 | Douty et al. | 439/247 |
| 5,344,332 | 9/1994 | Lopez et al. | 439/248 |

Primary Examiner—Gary F. Paumen
Attorney, Agent, or Firm—Blakely, Sokoloff, Taylor & Zafman

[57] ABSTRACT

A floating connector housing has an attachment area for attaching a first connector. The floating connector housing also has two or more flanges for connecting the floating connector housing to a fixed surface. The two or more flanges allow the floating connector to have limited movement within the plane of the fixed surface. The floating connector housing also has one or more alignment pins for aligning the floating connector housing to allow the first connector to couple to a second connector. The floating connector housing can be used to turn a non-floating connector into a floating connector.

21 Claims, 5 Drawing Sheets

FLOATING CONNECTOR HOUSING

FIELD OF THE INVENTION

The present invention relates to the field of electronics; more particularly, the present invention relates to connectors for coupling electronic components together.

BACKGROUND OF THE INVENTION

Many electronic components require connectors to couple various devices together. A computer system, for example, may use a multitude of connectors and cables to couple a printer, a network, and/or peripheral to the computer chassis.

Many connectors have a standard interface such as the 9-pin D-sub connector. Like most connectors, the 9-pin D-sub connector has either a male interface or a female interface. The male interface and its mating connector, the female interface, couple together to provide a connection for the 9 signal lines carried by each of the interfaces. The male interface has nine pins, and the female interface has nine holes. An outer jacket on the male interface is shaped like the letter 'D' such that the female interface, which is also shaped like the letter 'D', may only be coupled together with the male interface in a specific orientation since one side is longer than the other.

For certain applications, such as rack mounted devices, it is desirable to have a connector which can be easily coupled together without the need for manually aligning the two connectors. A blind connector is used in these situations. A blind connector has a fixed interface and a movable, or floating, interface. For example, a device which is to be installed into a rack mount chassis may have a floating blind connector interface, and the rack mount chassis may have a fixed blind connector interface. When the device is pushed into the rack mount chassis the floating interface aligns itself and couples with the fixed interface to provide physical connections between the signals of one interface with those of the other interface.

A blind connector allows ease of connection because the male interface and female interface form a connection without the need to manually align the two interfaces. The floating connector allows for one of the interfaces, either the male interface or the female interface, to move in order to couple with its mate.

Up until this time, floating connectors have been custom-made and relatively expensive. A cheap, relatively easy-to-make connector is desirable.

SUMMARY OF THE INVENTION

A floating connector housing has an attachment area for attaching a first connector. The floating connector housing also has two or more flanges for connecting the floating connector housing to a fixed surface. The two or more flanges allow the floating connector to have limited movement within the plane of the fixed surface. The floating connector housing also has one or more alignment pins for aligning the floating connector housing to allow the first connector to couple to a second connector.

BRIEF DESCRIPTION OF THE DRAWINGS

The present invention will be understood more fully from the detailed description given below and from the accompanying drawings of the preferred embodiments of the invention, which, however, should not be taken to limit the invention to the specific embodiments, but are for explanation and understanding only.

DETAILED DESCRIPTION OF THE PRESENT INVENTION

A method and apparatus for converting a non-floating connector to a floating connector is described. In the following detailed description of the present invention numerous specific details are set forth in order to provide a thorough understanding of the present invention. However, it will be obvious to one skilled in the art that the present invention may be practiced without these specific details.

Figure 1:
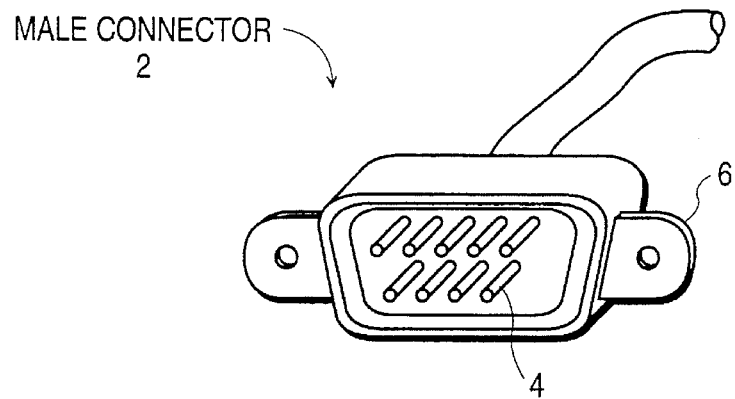
FIG. 1 is a representative drawing of a standard 9-pin D-sub male connector.

FIG. 1 is a representative drawing of a standard 9-pin D-sub male connector 2. The standard male connector 2 has a plurality of pins 4. The standard male connector 2 is shown with a mounting bracket 6, so that the connector can be mounted with screws to another device.

Figure 2:
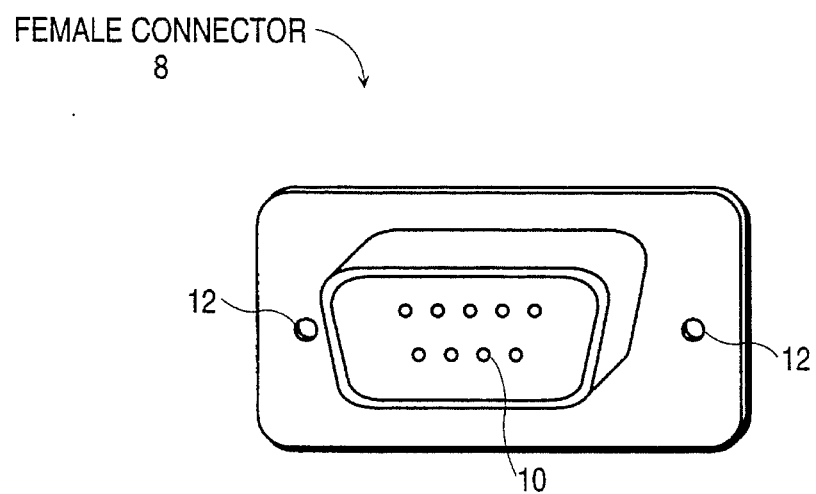
FIG. 2 is a representative drawing of a standard 9-pin D-sub female connector.

FIG. 2 is a representative drawing of a standard 9-pin D-sub female connector 8. The standard female connector 8 has a plurality of holes 10 which couple to the pins 4 of the standard male connector 2. The standard female connector 8 is shown mounted on the back of a metal panel. FIG. 2 also shows alignment holes 12 which will be described later.

Figure 3:
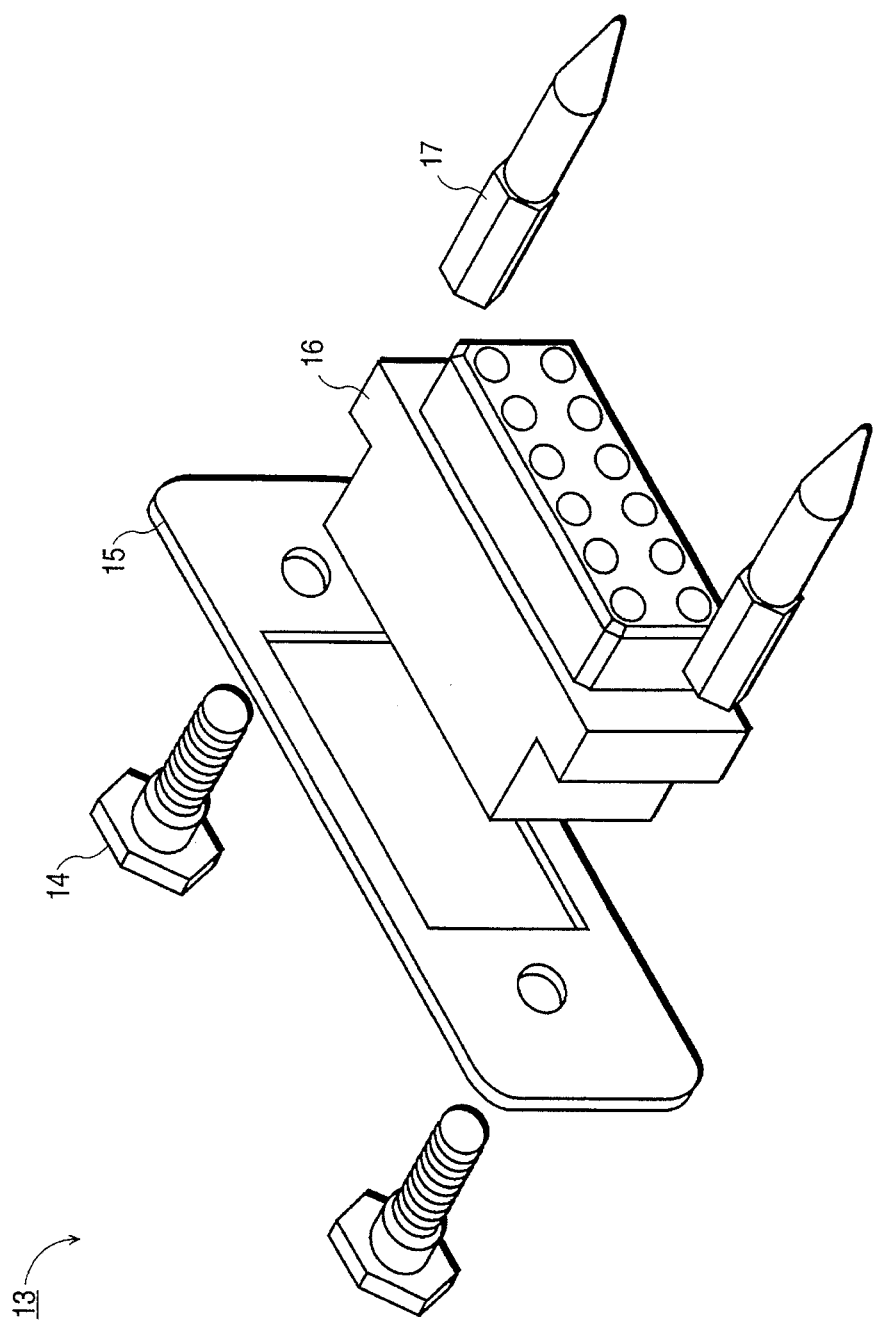
FIG. 3 shows one embodiment of a prior art custom floating connector.

FIG. 3 shows one embodiment of a prior art custom floating connector 13. The custom floating connector 13 is comprised of two custom nuts 14, a floating plate 15, a connector housing 16 and two custom guide pins 17. The floating connector 13 is secured to a metal plate (not shown), such as the back plate of a device, via the two custom nuts 14. The custom nuts 14 are inserted into holes in the metal plate then into the floating plate 15, and subsequently into the custom guide pins 17. The holes in the metal plate are larger than the diameter of the custom nuts, but are not as large as the hexagonal head of the custom nut. Since the nuts are not tightened to squeeze the metal plate between the custom nuts and the floating plate, the oversized holes in the metal plate allow the floating plate to have limited mobility within the plane of the metal plate.

A connector 16, which is typically made of non-conductive material, is coupled to the floating plate 15. The connector 16 houses various signal connections within it. Two custom guide pins 17 provide alignment when the floating connector 13 is coupled to its mating connector, as will be further described with respect to FIG. 4.

Figure 4:
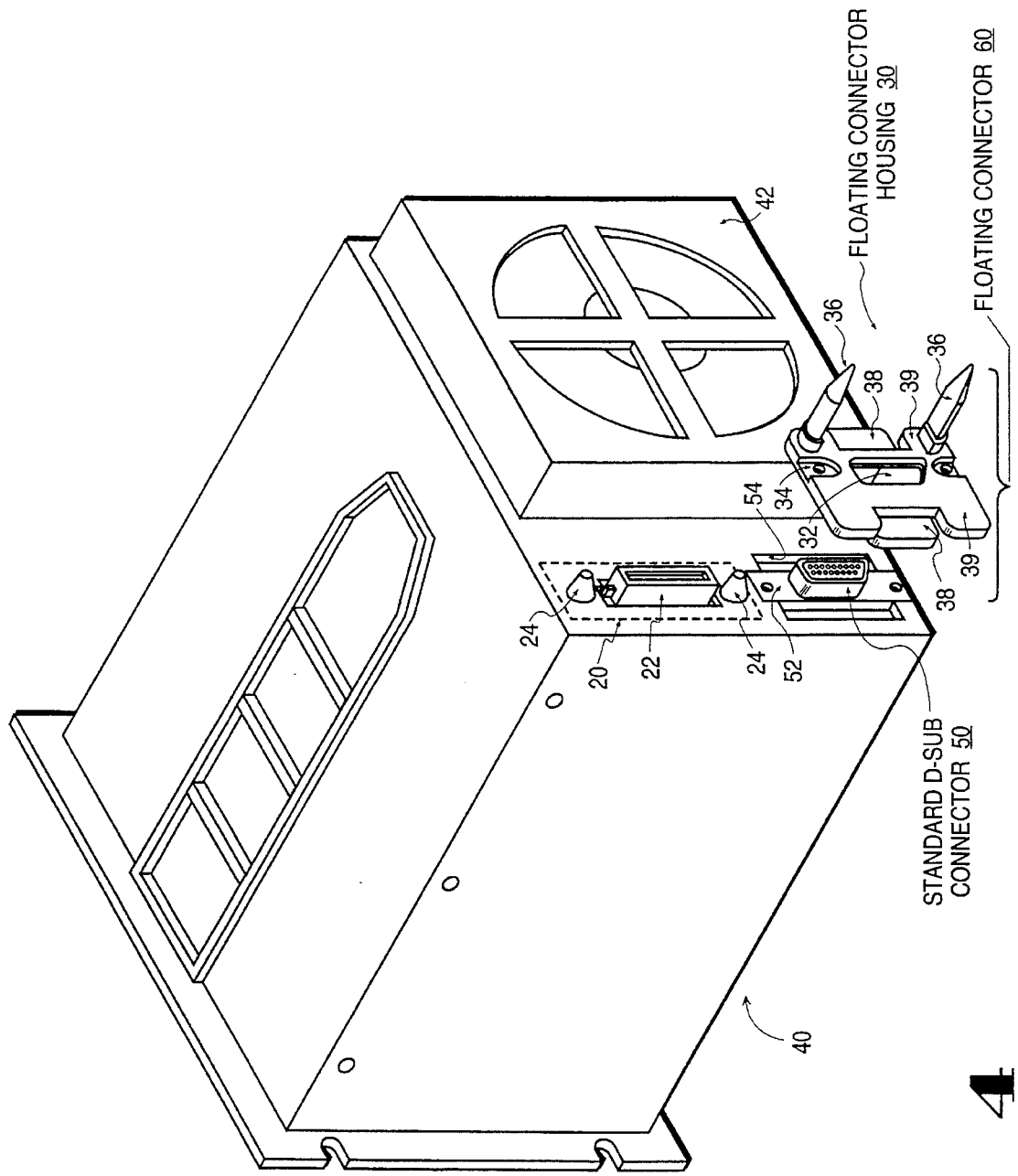
FIG. 4 shows another embodiment of a prior art floating connector and one embodiment of a floating connector housing of the present invention.

FIG. 4 shows another embodiment of a prior art floating connector 20 and one embodiment of a floating connector housing 30 of the present invention. The blind connector 20 is mounted on the backside of a device 40. A fan 42 is also mounted on the backside of the device 40. The blind connector 20 allows the device 40 to be plugged into a rack mount without the need for manual alignment of the connector. The blind connector 20 includes a shroud 22 and two alignment pins 24. The shroud houses signal connections within it. When the shroud is coupled to its mating connector, the signal connections within it are coupled to signal connections of its mating connector. The alignment pins 24 help align the device 40 when it is plugged into a rack mount. In one embodiment, the shroud 22 is tapered such that it is wider at the base, i.e., wider where the shroud attaches to the device 40. The shroud 22 has limited mobility for moving in the plane of the backside of the device 40 for coupling to its mating connector.

The floating connector housing 30 of the present invention has a cut-out portion 32 to which a standard D-sub connector 50 is attached. The standard D-sub connector 50 may be either a standard male connector 2 or a standard female connector 8. In one embodiment, the floating connector housing 30 is attached to the standard D-sub connector 50 using screws through attachment holes 34 in the floating connector housing to a mounting bracket 52 on the standard D-sub connector 50. In other embodiments, the floating connector housing 30 is attached to the standard D-sub connector 50 via a snap-together feature, or via a bonding agent. The standard D-sub connector 50 fits into the cut-out portion 32 of the floating connector to expose the signal connections of the standard D-sub connector.

In one embodiment, the floating connector housing 30 has two flanges 38 on two sides of its back side, and a locking plate 39. The flanges 38 are used to straddle a cutout 54 in the metal back plate of the device 40. The floating connector housing 30 has just enough clearance so that the flanges 38 can clear the cutout 54 in the metal back plate of the device 40 by slightly flexing the floating connector housing. Thus, once the floating connector housing has been snapped into place with its flanges 38 locked behind the metal back plate of the device 40, the floating connector housing will no longer be able to move in a direction perpendicular to the back plate of the device 40 because the back plate will be sandwiched between the flanges 38 and the locking plate 39. However, the floating connector housing will have limited mobility within the plane of the back plate of the device 40.

When the floating connector housing 30 and the standard D-sub connector 50 are attached together as a unit they form a floating connector 60. The floating connector housing 30 has two alignment pins 36. The alignment pins 36 are used to provide initial alignment during coupling of the floating connector 60 to a fixed mating connector such as that shown in FIG. 2. FIG. 2 shows two alignment holes 12, which are punch-outs in the sheet metal to which the mating connector is attached. When the floating connector 60 is used to couple to the connector in FIG. 2, the alignment pins 36 slide into the alignment holes 12. The flanges 38 allow the floating connector 60 to move into alignment as the floating connector 60 is pushed toward its mating connector in order to couple them together.

The floating connector housing 30 can be used with any non-floating connector in order to turn it into a floating connector. Additionally, the connectors need not have male and female interfaces; for example, they may have identical interfaces which couple together.

Figure 5:
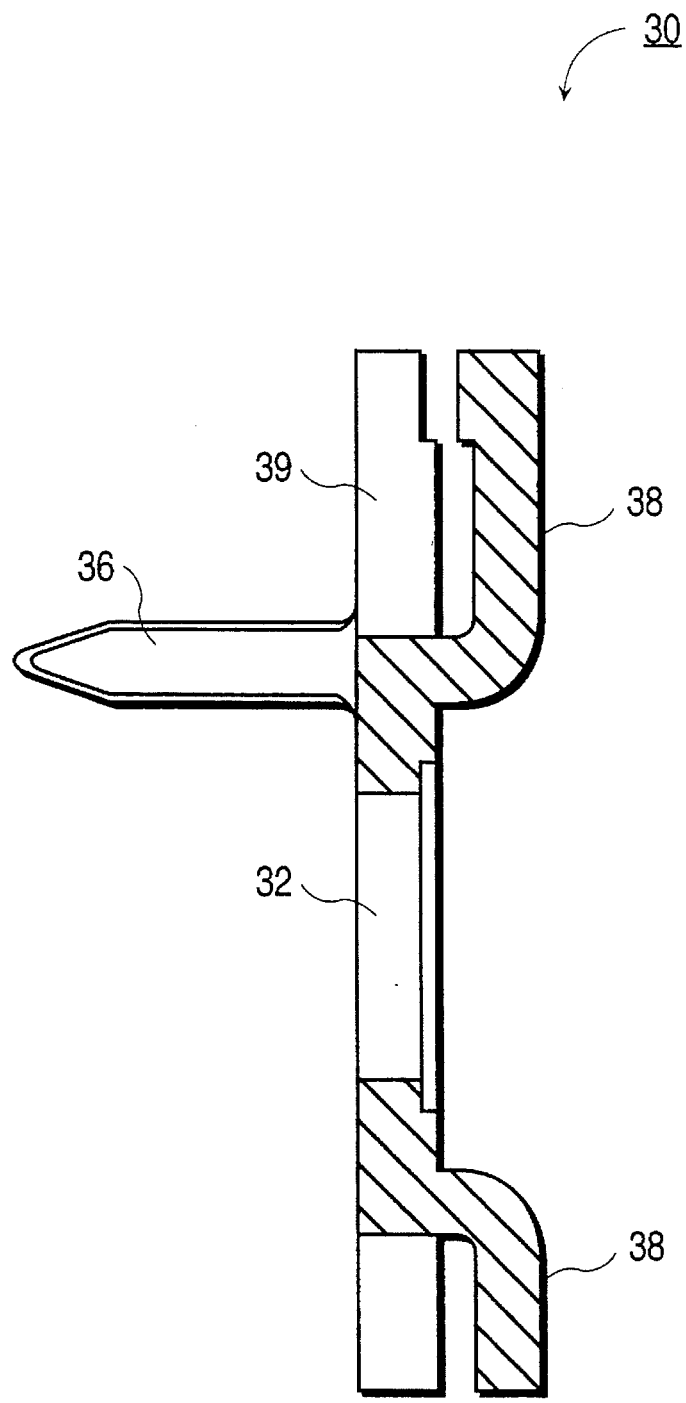
FIG. 5 shows a side view of the floating connector housing.

FIG. 5 shows a side view of the floating connector housing 30. The cutout 32 makes a hole in the center of the floating connector housing. The two alignment pins 36 and flanges 38 are shown.

In one embodiment, the floating connector housing 30 is made of a single piece of plastic made via an injection molding process. No machining of the part is necessary.

Figure 6:
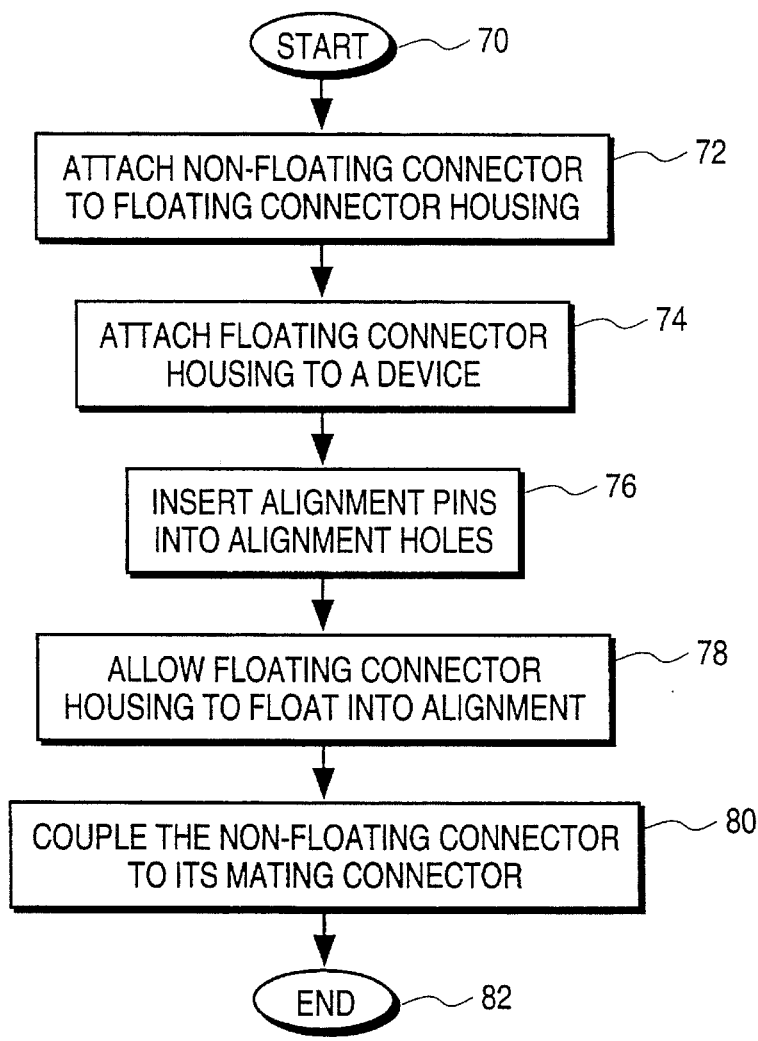
FIG. 6 shows a flow diagram showing the steps for using a floating connector housing to couple a non-floating connector with its mating connector.

FIG. 6 shows a flow diagram showing the steps for using a floating connector housing to couple a non-floating connector with its mating connector. The flow diagram starts at block 70 and proceeds at block 72, at which the non-floating connector is attached to the floating connector housing 30. From block 72, the flow diagram proceeds at block 74, at which the floating connector housing 30 is attached to a device 40. In one embodiment, two or more flanges 38 are used to secure the floating connector housing 30 to a metal plate of the device 40. The flow diagram proceeds at block 76, at which the alignment pins 38 of the floating connector housing are inserted into the alignment holes 12 which direct the floating connector housing to the mating connector.

From block 76, the flow diagram proceeds at block 78 at which the floating connector is allowed to float into alignment, i.e., the floating connector is allowed to move within a plane defined by the face of the mating connector in order to allow alignment of the non-floating connector to its mating connector. Operation proceeds at block 80, at which the non-floating connector and its mating connector are finally coupled together to form connections between the signals in each of the connectors. From block 80, operation moves to flow block 82, at which the flow diagram terminates.

Thus, an apparatus and method for creating a floating connector from a non-floating connector is disclosed. The specific arrangements and methods described herein are merely illustrative of the principles of this invention. Numerous modifications in form and detail may be made without departing from the scope of the described invention. Although this invention has been shown in relation to a particular embodiment, it should not be considered so limited. Rather, the described invention is limited only by the scope of the appended claims.

What is claimed is:

1. A floating connector housing comprising:

an attachment area for attaching a first connector thereto;

two or more flanges for engaging a first surface of a plate of a device, the two or more flanges cooperating with a locking surface of the floating connector housing, said locking surface engaging an opposing second surface of the plate to lock the floating connector housing to the plate by sandwiching the plate between the flanges and the locking surface, the two or more flanges allowing the floating connector housing to have limited movement within a plane of the plate; and one or more alignment pins extending forwardly in a coupling direction for aligning the floating connector housing with a second connector to allow the first connector to couple to the second connector.

2. The floating connector housing of claim 1 wherein the floating connector housing is made of plastic.

3. The floating connector housing of claim 1 wherein the floating connector housing is a single unit made via an injection molding process.

4. The floating connector housing of claim 1 wherein the floating connector housing has two holes for mounting the first connector to the floating connector housing.

5. The floating connector housing of claim 1 wherein the one or more alignment pins have tapered ends.

6. The floating connector housing of claim 1 wherein the first connector and the second connector are standard D-sub connectors.

7. A floating connector housing comprising:

a first attachment means for attaching a first connector to the floating connector housing;

a second attachment means for engaging a first surface of a plate of a device, the second attachment means cooperating with a locking surface of the floating connector housing, said locking surface engaging an opposing second surface of the plate to lock the floating connector housing to the plate by sandwiching the plate between the second attachment means and the locking surface, the second attachment means allowing the floating connector housing to move within a plane of the plate; and an alignment means extending forwardly in a coupling direction for aligning the first connector to couple with a second connector, wherein the first attachment means, the second attachment means, and the alignment means are a single unit made via an injection molding process.

8. The floating connector housing of claim 7 wherein the floating connector housing is made of plastic.

9. The floating connector housing of claim 7 wherein the first attachment means includes two holes for mounting the first connector to the floating connector housing.

10. The floating connector housing of claim 7 wherein the second attachment means are two or more flanges.

11. The floating connector housing of claim 7 wherein the alignment means are one or more alignment pins which have tapered ends.

12. A method of using a floating connector housing to couple a first standard connector to a second standard connector, the method comprising the steps of:

(a) attaching the first standard connector to the floating connector housing, the floating connector housing having one or more forwardly extending alignment pins;

(b) attaching the floating connector housing to a a first surface of a plate of a device via flanges on the floating connector housing, the flanges cooperating with a locking surface of the floating connector housing, said locking surface engaging an opposing second surface of the plate to lock the floating connector housing to the plate by sandwiching the plate between the flanges and the locking surface;

(c) inserting the one or more alignment pins into one or more alignment holes of the second connector;

(d) allowing the floating connector housing to float to align of the first standard connector with the second standard connector; and (e) coupling the first standard connector to the second standard connector.

13. The method of claim 12 wherein the floating connector housing is made of plastic.

14. The method of claim 12 wherein the floating connector housing is a single unit made via an injection molding process.

15. A method of converting a non-floating connector into a floating connector, the non-floating connector having a corresponding mating connector, the method comprising the step of:

(a) attaching the non-floating connector to a floating connector housing, the floating connector housing having two or more flanges for engaging a first surface of a plate of a device, the two or more flanges cooperating with a locking surface of the floating connector housing, said locking surface engaging an opposing second surface of the plate to lock the floating connector housing to the plate by sandwiching the plate between the flanges and the locking surface, the two or more flanges allowing the floating connector housing to move within a plane of the plate; and one or more alignment pins extending forwardly in a coupling direction for aligning the floating connector housing to allow coupling between the non-floating connector and its corresponding mating connector.

16. The method of claim 15 wherein the floating connector housing is a single unit made via an injection molding process.

17. The method of claim 15 wherein the floating connector housing is a single piece of plastic.

18. A method of converting a non-floating connector into a floating connector, the non-floating connector having a corresponding mating connector, the method comprising the step of:

(a) attaching the non-floating connector to a floating connector housing, the floating connector housing manufactured via an injection molding process, the floating connector housing having an attachment means for engaging a first surface of a plate of a device, the attachment means cooperating with a locking surface of the floating connector housing, said locking surface engaging an opposing second surface of the plate to lock the floating connector housing to the plate by sandwiching the plate between the attachment means and the locking surface;

a floating means for allowing the floating connector to move in a plane of the plate during coupling between the non-floating connector and its corresponding mating connector; and an alignment means extending forwardly from the floating connector housing in a coupling direction for aligning the floating connector housing to allow coupling between the non-floating connector and its corresponding mating connector.

19. The method of claim 18 wherein the floating connector housing is a single piece of plastic.

20. The method of claim 18 wherein the attachment means are two or more flanges.

21. The method of claim 18 wherein the non-floating connector is a standard D-sub connector.

* * * * *